United States Patent [19]

Engdahl et al.

[11] Patent Number: 4,914,412
[45] Date of Patent: Apr. 3, 1990

[54] MAGNETIC CIRCUIT

[75] Inventors: Göran Engdahl, Täby; Lars Kvarnsjö, Stockholm, both of Sweden

[73] Assignee: Asea Brown Boveri AB, Vësterås, Sweden

[21] Appl. No.: 341,823

[22] Filed: Apr. 24, 1989

[30] Foreign Application Priority Data

Jan. 16, 1989 [SE] Sweden .................................. 8900135

[51] Int. Cl.$^4$ .............................................. H01F 7/00
[52] U.S. Cl. ...................................... 335/215; 335/284
[58] Field of Search ............... 335/215, 284, 296, 297, 335/302

[56] References Cited

U.S. PATENT DOCUMENTS 4,599,591  7/1986  Delvecchio et al. ............... 335/215
4,845,450  7/1989  Porzio et al. ......................... 335/215

*Primary Examiner*—George Harris
*Attorney, Agent, or Firm*—Watson, Cole, Grindle & Watson

[57] ABSTRACT

A specially designed magnetic circuit which is provided which is intended to magnetize cylindrically shaped magnetic materials (1) in the axial direction. The magnetic circuit comprises a magnetizing coil (2), permanent magnets (5, 6), and magnetic return conductors (3, 7) of a ferromagnetic material. The magnetic circuit is well suited to utilize the magnetostrictive properties of a magnetic material.

3 Claims, 1 Drawing Sheet

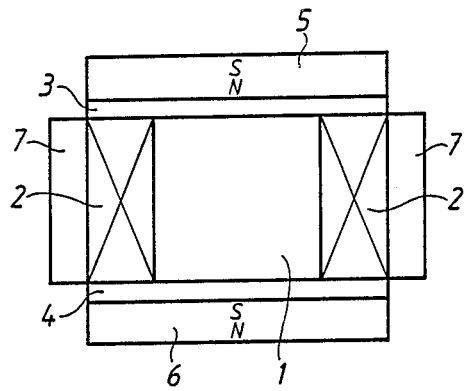

MAGNETIC CIRCUIT

TECHNICAL FIELD

A magnetic circuit according to the invention is included in means or devices which are based substantially on the utilization of the magnetostrictive properties of a magnetic material. The invention is therefore very well suited for use where so-called giant magnetostrictive materials, for example Terfenol and other materials, are used in transducers, spring elements, and the like.

Since the magnetic circuit provides a very homogeneous and efficient magnetization of the magnetic material used, both statically and dynamically, the magnetic circuit may also be used in other applications than those which require a giant magnetostrictive material.

BACKGROUND ART

A magnetic circuit intended to utilize the magnetostrictive properties of a giant magnetostrictive material is disclosed, inter alia, in PCT patent application WO 86/03888 entitled "A rare earth flextensional transducer". The movement of the transducer is here brought about with the aid of a number of basic elements, stacked in a row one after the other, each element consisting of a rod or a giant magnetostrictive material. The rod is magnetized with a surrounding coil and is, in addition, bias magnetized with the aid of permanent magnets positioned at both ends.

Another example of a magnetic circuit including rods of a giant magnetostrictive material is disclosed in British patent application GB 2 174 863 A entitled "Permanent magnet biased magnetostrictive transducer". Here four basic elements, each being rotated 90° in relation to one another, form a square shape. The rod in each basic element is also here surrounded by a magnetizing coil outside of which permanent magnets for the bias magnetization are arranged.

It is obvious that the efficiency of the known magnetic circuits leaves a great deal to be desired because of the great leakage fluxes arising. This also results in the magnetic flux in the rods not becoming as homogeneous as is desirable to obtain maximum power caused by the magnetostriction.

DISCLOSURE OF THE INVENTION

The invention comprises a specially designed magnetic circuit which is intended to magnetize cylindrically shaped magnetic materials, hereafter called magnetic rods, in an axial direction, both statically and dynamically, with great efficiency. The static magnetization is performed with the aid of permanent magnets. The dynamic magnetization is performed with the aid of a coil which surrounds the magnetic rod and has the same axial length as such rod. This will cause the end surfaces of the coils to coincide with the end surfaces of the magnetic rod, thus forming two whole plane surfaces of the circle with an outer diameter equal to the outer diameter of the coil.

The two plane surfaces of the circle are each covered with a circular disc with the same diameter as the outer diameter of the coil. The discs are made from a ferromagnetic material with low losses.

The permanent magnets which are to effect the static magnetization are shaped as discs with the same diameters as the above-mentioned soft-magnetic discs and are applied on the outside of these soft-magnetic discs. The orientation of the permanent-magnetic discs is arranged such that the north-magnetic pole of one disc faces one of the soft-magnetic discs and the south-magnetic pole of the other disc faces the other soft-magnetic disc.

Finally, the magnetic circuit comprises a cylindrical, circular ring surrounding the coil and having an axial length equal to that of the coil. The cylindrical ring also consists of a ferro-magnetic material having low losses.

In this way, the soft-magnetic discs and the soft-magnetic ring will touch one another in the outer diameter of the plane-parallel surfaces of the circle.

The embodiment of the magnetic circuit described above results in the magnetic energy related to the static and dynamic H-field substantially being located in the magnetic material used, the H-field being very homogeneous within the entire magnetic material used, and in a very small magnetic field being located outside the magnetic circuit.

There are several explanations why the above properties can be achieved. Since the soft-magnetic discs and the soft-magnetic cylindrical ring only touch one another, the greater part of the magnetic flux from the permanent magnets will flow in the magnetic material used, and because of the shape of the permanent magnet, the flux through the magnetic rod will be homogeneous. Because the soft-magnetic discs and the cylindrical circular ring of soft-magnetic material only touch one another, as mentioned above, only a small pat of the flux from the permanent magnets will be shunted via the ring.

As already mentioned, the dynamic magnetization is achieved by current flowing through the winding turns of the coil. The flux which is thus generated will then, based on the direction of the current in the coil, either coincide with the direction of the static flux, or be directed opposite thereto. In this way, the magnetic circuit for the dynamic flux consists of the magnetic material in question, i.e. the magnetic rod, the soft-magnetic discs, and the soft-magnetic ring. This circuit is consequently closed except for the air gap which occurs as a result of the discs and the ring only touching one another. From the point of view of the magnetic material in question, however, the embodiment provides a very efficient and homogeneous magnetization.

In the same way as described in the above-mentioned PCT application, it is self-evident that basic elements according to the magnetic circuit described above can be stacked one above the other to achieve increased magnetostrictive effect.

To achieve the best result with the magnetic circuit described, the dimensioning of the different parts of the circuit is very important.

Because of the high B-field that will occur, it is also very important that the soft-magnetic return conductors are made from a material with low loss properties. Suitable such materials will be mentioned in connection with the description of the preferred embodiments of the magnetic circuits.

An interesting feature of the magnetic circuit according to the invention is that it can be used as an electrical generator. By allowing the magnetic material used to be subjected to periodic compressive stresses via the permanent magnets, an alternating voltage with the same frequency will be generated in the surrounding coil.

The magnetic material used may, of course, have sectional areas other than the purely circular area, depending on the application in question, etc. The coil, the discs, and the ring must then also be adapted to the sectional area in question. The homogeneous distribution of the flux will, however, suffer somewhat from this.

DESCRIPTION OF THE PREFERRED EMBODIMENT

A preferred embodiment of a magnetic circuit according to the invention will be clear from the accompanying single FIGURE. The magnetic material to be magnetized consists of a cylindrical body or magnetic rod 1. It is surrounded by a magnetizing coil 2 which has the same axial length as the magnetic rod 1. The plane surfaces of the circle formed by the end surfaces of the magnetic rod 1 and the end surfaces of the coil 2 are covered by circular discs 3 and 4 having the same outer diameter as that of the coil 2 and—as mentioned above—made from a ferromagnetic material having low losses.

For the static magnetization of the magnetic circuit, permanent magnets 5 and 6 are used which are formed as discs having the same outer diameter as that of the soft-magnetic discs 3, 4 and arranged outside thereof. The permanent magnets 5, 6 are oriented such that they are magnetically attracting.

A cylindrical ring 7 having the same axial length as that of the coil 2 surrounding the coil 2. It is also made from a ferro-magnetic material with low losses.

To obtain an optimum function, i.e. to obtain a flux which is as axially homogeneous as possible in the magnetic material and as small a leakage as possible, certain given conditions regarding the magnetic and the mechanical dimensioning should suitably exist.

If it is assumed that the cylindrical body 1 to be magnetized has an axial length A, in a preferred embodiment the diameter of the cylindrical body 1 may lie between $\frac{1}{2}$ A and 2 A. The coil 2 which closely surrounds the cylindrical body 1, and which also has an axial length A, suitably has an outer diameter of between 1.2 A and 4 A. The cylindrical circular ring 7 of a soft-magnetic material with the axial length A, which in turn surrounds the coil 2, suitably has a wall thickness of between 0.05 A and 1 A.

The circular discs 3 and 4 of the soft-magnetic material with a diameter equal to the outer diameter of the coil 2 preferably have a height of between 0.025 A and 1 A.

The disc-shaped, circular permanent magnets 5 and 6 with a diameter equal to the outer diameter of the coil 2 suitably have a height of between 0.025 A and 1 A.

Theoretical calculations have shown that by stacking five magnetic circuits according to the figure with permanent magnets of the VACTEK permanent-magnetic VACODYM one after the other and where A ~ 30 mm, a very homogeneous axial H-field of 80 kA/m can be obtained.

Theoretical calculations have also shown that if the coils for each section or magnetic circuit are wound with 100 turns and with a current of 30 amperes, depending on the direction of the current the H-field in the magnetic material used will be practically axial and homogeneous and either about 0.4 kA/m or about 180 kA/m.

As mentioned above, it is important to select a ferromagnetic material processing good low-loss properties to avoid heating caused by eddy currents and other phenomena in the magnetic return conductors. In this connection, it has proved to be suitable to use discs and rings, respectively, which are compression-moulded or sintered from a ferromagnetic powdered material.

We claim:

1. A magnetic circuit for magnetization of cylindrically shaped magnetic materials (1) in the axial direction, said magnetic circuit comprising a magnetizing coil (2), permanent magnets (5, 6) for magnetization of the magnetic material, and magnetic return conductors (3, 7) of a ferromagnetic material with low losses, said magnetizing coil is arranged to surround the cylindrically shaped magnetic material and to have the same axial extension, at this, a cylindrical circular ring (7) of a ferromagnetic material with low losses is arranged to surround the magnetizing coil and to have the same axial extension as the cylindrically shaped magnetic material and the coil, against the two parallel and plane surfaces of the circle formed by the cylindrically shaped material and the end surfaces of the magnetizing coil, there are arranged circular discs of a ferromagnetic material with low losses and with the same diameter as the outer diameter of the magnetizing coil, and wherein against each of said discs there are arranged permanent magnets shaped discs and having the same diameter as the outer diameter of the magnetizing coil.

2. A magnetic circuit according to claim 1, wherein the parts included in the magnetic circuit are arranged with a certain geometrical size ratio to each other.

3. A magnetic circuit according to claims 1 or 2, wherein the cylindrically shaped magnetic material is arranged with a diameter of between 0.5 and 2 times the axial length of the cylindrically shaped material, the surrounding magnetizing coil is arranged with an outer diameter of between 1.2 and 4 times the axial length of the cylindrically shaped magnetic material, the circular ring surrounding the coil is arranged with a wall thickness of between 0.05 and 1 time the axial length of the cylindrically shaped magnetic material, the circular discs of a ferromagnetic material is arranged with a height of between 0.025 and 1 time the axial length of the cylindrically shaped magnetic material, and wherein the circular permanent-magnetic discs are arranged with a height of between 0.025 and 1 time the axial length of the cylindrically shaped magnetic material.

* * * * *